United States Patent
Ho et al.

(10) Patent No.: US 11,356,142 B2
(45) Date of Patent: Jun. 7, 2022

(54) TRANSCEIVER AND SIGNAL PROCESSING METHOD APPLIED IN TRANSCEIVER

(71) Applicant: Realtek Semiconductor Corp., HsinChu (TW)

(72) Inventors: Hsuan-Ting Ho, Taichung (TW); Liang-Wei Huang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 83 days.

(21) Appl. No.: 17/078,114

(22) Filed: Oct. 23, 2020

(65) Prior Publication Data

US 2021/0135706 A1 May 6, 2021

(30) Foreign Application Priority Data

Nov. 5, 2019 (TW) ................................. 108140029

(51) Int. Cl.
*H04B 3/23* (2006.01)
*H04B 3/20* (2006.01)
*H03M 1/12* (2006.01)
*H04L 5/14* (2006.01)
*H04B 1/40* (2015.01)
(Continued)

(52) U.S. Cl.
CPC ............ *H04B 3/20* (2013.01); *H03K 5/01* (2013.01); *H03M 1/12* (2013.01); *H04B 1/40* (2013.01); *H04L 5/1461* (2013.01); *H03K 2005/00286* (2013.01)

(58) Field of Classification Search
CPC ... H04B 1/40; H04B 3/20; H04B 3/23; H04B 3/231; H04B 3/237; H03K 5/01; H03K 2005/00286; H04L 5/14; H04L 5/1461; H04L 25/03006; H04L 2012/6491; H03M 1/12; H04W 72/1268
See application file for complete search history.

(56) References Cited

U.S. PATENT DOCUMENTS 5,793,801 A 8/1998 Fertner
6,534,996 B1 3/2003 Amrany
(Continued)

OTHER PUBLICATIONS

Avasarala, Adaptive Baseband Interference Cancellation for Full Duplex Wireless Communication Systems, Thesis, Arizona State University, 77 pages, May 2016.*
(Continued)

*Primary Examiner* — Frank Duong
(74) *Attorney, Agent, or Firm* — Winston Hsu

(57) ABSTRACT

A transceiver circuit includes an ADC and an echo-cancellation circuit, wherein the echo-cancellation circuit includes a steady circuit, a transient circuit and an output circuit. In the operations of the transceiver circuit, the ADC is configured to perform an analog-to-digital conversion operation on an analog input signal to generate a digital input signal. The steady circuit is configured to generate a steady echo response according to a transmitting signal. The transient circuit is configured to generate an echo response adjustment signal according to a phase change of a clock signal used by the transmitting signal. The output circuit is configured to generate an output signal according to the digital input signal, the steady echo response, and the echo response adjustment signal.

12 Claims, 9 Drawing Sheets

(51) Int. Cl.
*H03K 5/01* (2006.01)
*H03K 5/00* (2006.01)

(56) References Cited

U.S. PATENT DOCUMENTS

| | | | |
|---|---|---|---|
| 6,853,626 B1* | 2/2005 | Farhang-Boroujeny | ..................... H04B 3/23 379/406.01 |
| 2001/0055331 A1* | 12/2001 | Agazzi | ..................... H04B 3/23 375/216 |
| 2003/0138038 A1 | 7/2003 | Greiss | |
| 2006/0007992 A1* | 1/2006 | Wang | ........................ H04B 3/46 375/224 |
| 2019/0245673 A1* | 8/2019 | Lin | ........................ H04L 5/1461 |

OTHER PUBLICATIONS

Hurst et al., DAC Quantization-Noise Cancellation in an Echo-Canceling Transceiver, IEEE, 5 pages, 2007.*
Lee et al., 125-MHz Mixed-Signal Echo Canceller for Gigabit Ethernet on Copper Wire, IEEE, 8 pages, Mar. 2001.*

* cited by examiner

TRANSCEIVER AND SIGNAL PROCESSING METHOD APPLIED IN TRANSCEIVER

BACKGROUND OF THE INVENTION

1. Field of the Invention

The present invention relates to a transceiver, and more particularly, to a transceiver comprising an echo-cancellation circuit.

2. Description of the Prior Art

In a full-duplex Ethernet system, a master device first sends a free-run symbol to a slave device, and then the slave device locks a frequency of the symbol and uses the frequency to send a signal back to the master device. In addition, because of the full-duplex architecture, the transmission line between the master device and the slave device will have both a transmitting signal and a receiving signal, and if the transmission line has an impedance mismatch or the receiver does not match the relevant circuit architecture, some of the signal components in the transmitting signal will bounce back into the receiving path, and these bounced signal components are generally called echo signals.

Since an oscillator in the master device and an oscillator in the slave device will not be completely the same, a receiver in the slave device locks the frequency of the clock signal of the master device by changing a phase of the clock signal, and then a transmitter within the slave device uses this phase-changed clock signal to send signals to the master device. However, the above method of changing the phase of the clock signal in the receiver and then changing the phase of the clock signal in the transmitter will generate a transient echo response, which affects the system performance. On the other hand, considering the circuit cost, phase adjustment amount of the clock signal will be designed larger to reduce the complexity of a phase selector, however, increasing the phase adjustment amount for each phase adjustment of the clock signal will make the transient echo response worse.

SUMMARY OF THE INVENTION

It is therefore an objective of the present invention to provide a transceiver circuit, which can effectively eliminate the transient echo response when the phase of the clock signal used by the transmitter is changed, to solve the above-mentioned problems.

According to one embodiment of the present invention, a transceiver circuit comprising an analog-to-digital converter (ADC) and an echo-cancellation circuit is disclosed, wherein the echo-cancellation circuit comprises a steady circuit, a transient circuit and an output circuit. In the operations of the transceiver circuit, the ADC is configured to perform an analog-to-digital conversion operation on an analog input signal to generate a digital input signal. The steady circuit is configured to generate a steady echo response according to a transmitting signal. The transient circuit is configured to generate an echo response adjustment signal according to a phase change of a clock signal used by the transmitting signal. The output circuit is configured to generate an output signal according to the digital input signal, the steady echo response, and the echo response adjustment signal.

According to another embodiment of the present invention, a signal processing method applied to a transceiver circuit is disclosed. The signal processing method comprises the steps of: performing an analog-to-digital conversion operation on an analog input signal to generate a digital input signal; generating a steady echo response according to a transmitting signal; generating an echo response adjustment signal according to a phase change of a clock signal used by the transmitting signal; and generating an output signal according to the digital input signal, the steady echo response, and the echo response adjustment signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
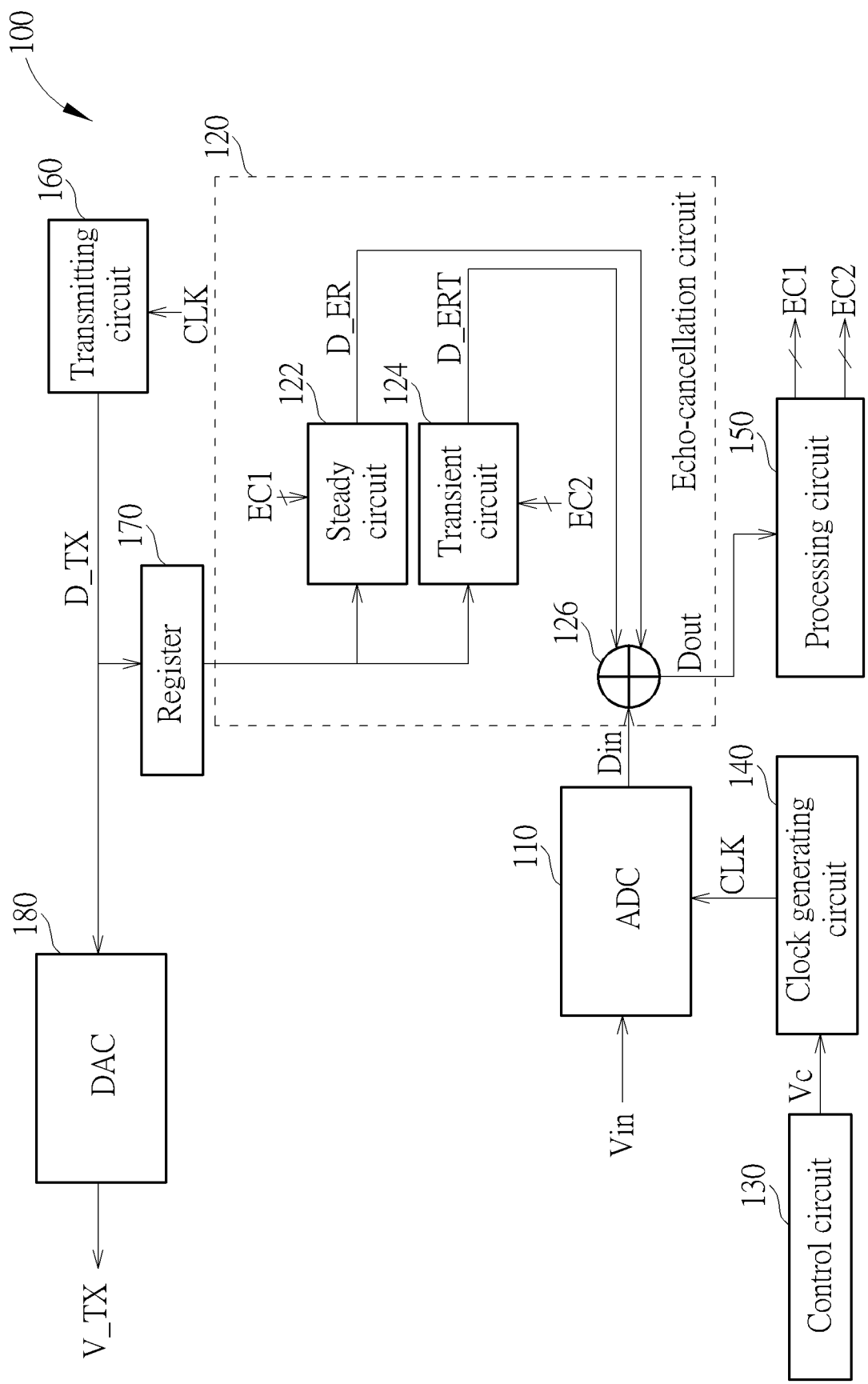
FIG. 1 is a diagram of a transceiver circuit applied to a full-duplex Ethernet network according to an embodiment of the present invention.

FIG. 1 is a diagram of a transceiver circuit 100 applied to a full-duplex Ethernet network according to an embodiment of the present invention. As shown in FIG. 1, the transceiver circuit 100 comprises an ADC 110, an echo-cancellation circuit 120, a control circuit 130, a clock generating circuit 140, a processing circuit 150, a transmitting circuit 160, a register 170 and a digital-to-analog converter (DAC) 180, where the echo-cancellation circuit 120 comprises a steady circuit 122, a transient circuit 124 and an output circuit 126. In this embodiment, the transceiver circuit 100 is positioned in a slave device, that is the transceiver circuit 100 receives a symbol from a master device, and locks a frequency of the symbol by adjusting a phase of a clock signal CLK generated by the clock signal generating circuit 140.

In the operation of the transceiver circuit 100, the ADC 110 receives an analog input signal Vin from the master device, and performs an analog-to-digital conversion operation on the analog input signal Vin according to the clock signal CLK to generate a digital input signal Din. Then, since the transceiver circuit 100 is applied to a full-duplex Ethernet network, when the transmitting circuit 160 generates a digital transmitting signal D_TX, and the digital transmitting signal D_TX is converted to an analog transmitting signal V_TX to the master device by using the DAC 180, the analog transmitting signal V_TX will have some energy rebound, so that the analog input signal Vin contains this echo signal. Therefore, in order to eliminate this echo signal, the digital transmitting signal D_TX is transmitted to the steady circuit 122 of the echo cancellation circuit 120 through the register 170, and the steady circuit 122 includes a finite impulse response (FIR) filter for generating a steady echo response D_ER, and then the output circuit 126 subtracts the steady echo response D_ER from the digital input signal Din to generate an output signal Dout. If the steady echo response D_ER is not equal to the echo component contained in the digital input signal Din, there will be an echo cancellation error in the output signal Dout. At this time, the processing circuit 150 may use a least mean square (LMS) algorithm to generate a control signal EC1 to update tap coefficients used by the FIR filter in the steady circuit 122, so that the steady echo response D_ER is closer to the echo component contained in the digital input signal Din.

On the other hand, since oscillators in the master device and the slave device will not be completely the same, the control circuit 130 generates a control signal Vc to the clock generating circuit 140 to adjust the phase of the clock signal CLK (it can also be regarded as adjusting the frequency of the clock signal CLK) to lock the frequency of the analog input signal Vin from the master device. After the phase of the clock signal CLK is adjusted, the transmitting circuit 160 also uses the phase-adjusted clock signal CLK to generate the digital transmitting signal D_TX. However, this operation of using the adjusted clock signal CLK to sample the analog input signal Vin firstly, and then using the adjusted clock signal CLK to generate the digital transmitting signal D_TX will change the echo response, that is a transient echo response different from the steady echo response D_ER is generated. In order to solve the problem of transient echo response, the transient circuit 124 included in the echo-cancellation circuit 120 generates an echo response adjustment signal D_ERT according to the digital transmitting signal D_TX, for adjusting the steady echo response D_ER to generate a transient echo response. Taking FIG. 1 as an example, the difference between the steady echo response D_ER and the echo response adjustment signal D_ERT can be regarded as the transient echo response, and the output circuit 126 subtracts the transient echo response by the digital input signal Din to generate the output signal Dout. If the transient echo response is not equal to the echo component contained in the digital input signal Din, there will be an echo cancellation error in the output signal Dout. At this time, the processing circuit 150 uses the LMS algorithm to generate a control signal EC2 to update tap coefficients used by a FIR filter in the transient circuit 124, so that the transient echo response is closer to the echo component contained in the digital input signal Din.

As described above, by using the transient circuit 124, the appropriate echo response adjustment signal D_ERT can be generated when the phase of the clock signal CLK is changed, so that the output circuit 126 can effectively and accurately delete the echo component of the digital input signal Din. In addition, the transient circuit 124 only needs to be enabled to generate the echo response adjustment signal D_ERT when the phase of the clock signal CLK changes, and the transient circuit 124 can be disabled to save power when the transient echo response disappears.

Figure 2A:
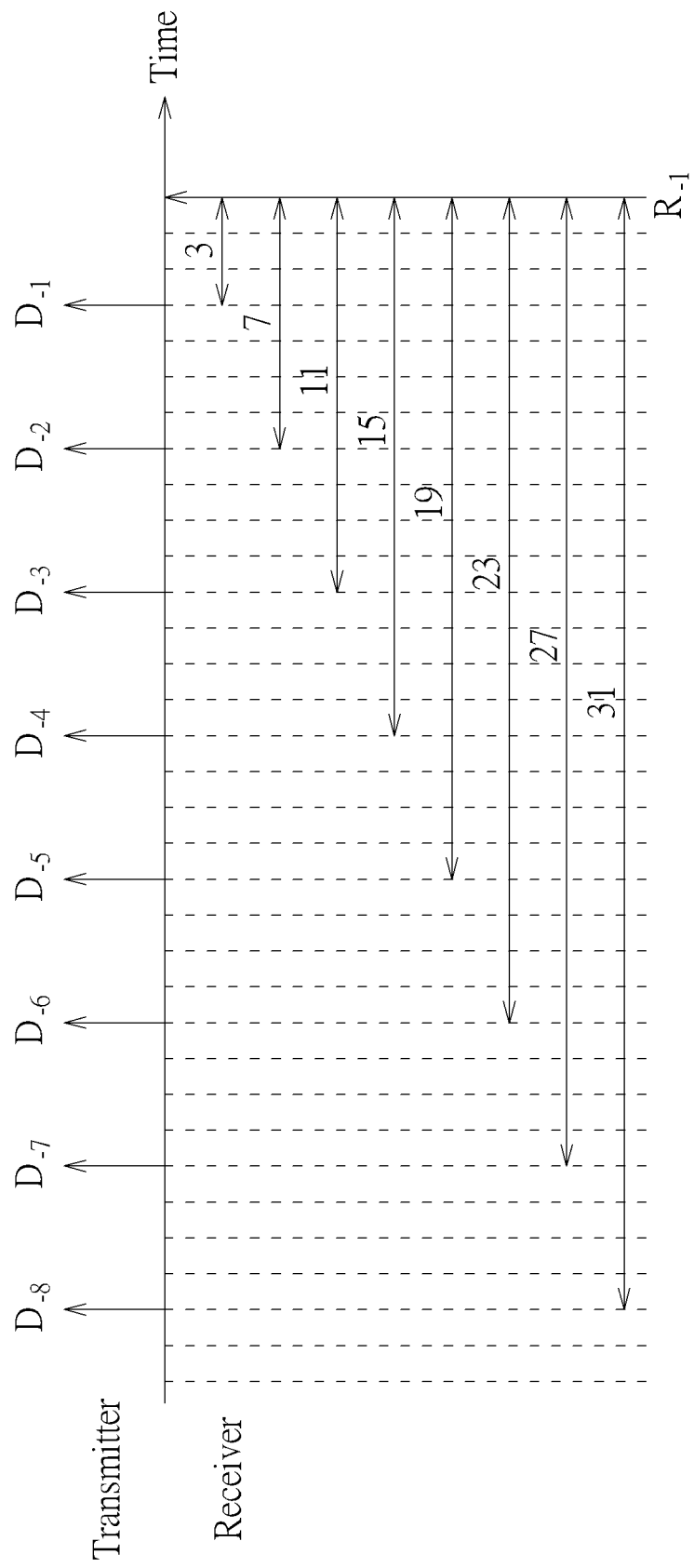
FIGS. 2A-2D are diagrams of a transient echo response when a phase of a clock signal changes.

FIGS. 2A-2D are diagrams of the transient echo response when the phase of the clock signal CLK changes, wherein FIGS. 2A-2D assume that each time the clock signal CLK has a phase adjustment, the phase adjustment amount is a quarter of a period of the clock signal CLK. It is noted that, this is only for convenience of description, and not a limitation of the present invention. Referring to FIG. 2A first, where $D_{-1}$-$D_{-8}$ represent the data of the digital transmitting signal D_TX at different time points, and $R_{-1}$ represents a time point that the ADC 110 uses the clock signal CLK to sample the analog input signal Vin. The time differences between $R_{-1}$ and each of $D_{-1}$-$D_{-8}$, that is "3", "7", "11", "15", "19", "23", "27", "31", can reflect the steady echo response D_ER, which corresponds to tap coefficients C0-C7 of the FIR filter within the steady circuit 122. Ideally, when the frequency/phase of the clock signal CLK has not changed for a period of time, the tap coefficients C0-C7 will be stable and become fixed values.

Figure 2B:
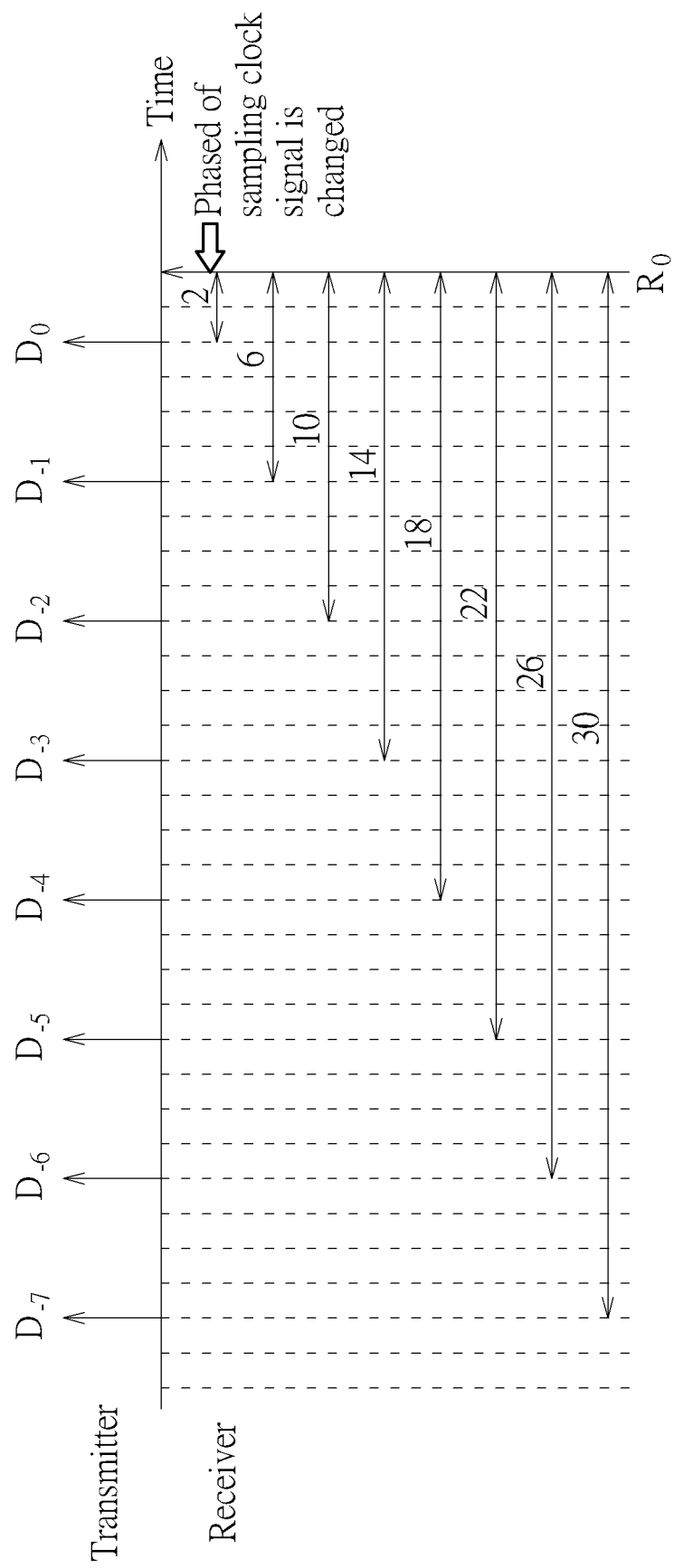

Then, in FIG. 2B, it is assumed that the control circuit 130 generates the control signal Vc to the clock generating circuit 140 to change the phase of the clock signal CLK to compensate a frequency offset from the master device, for example, to make the phase of the clock signal CLK one quarter cycle ahead. At this time, the time differences between $R_0$ and each of $D_0$-$D_{-7}$ become "2", "6", "10", "14", "18", "22", "26", "30", which means that the echo response has changed comprehensively. The echo response at this time can be regarded as the transient echo response, and the current tap coefficients C0-C7 used by the FIR filter in the steady circuit 122 cannot reflect the transient echo response.

Figure 2C:
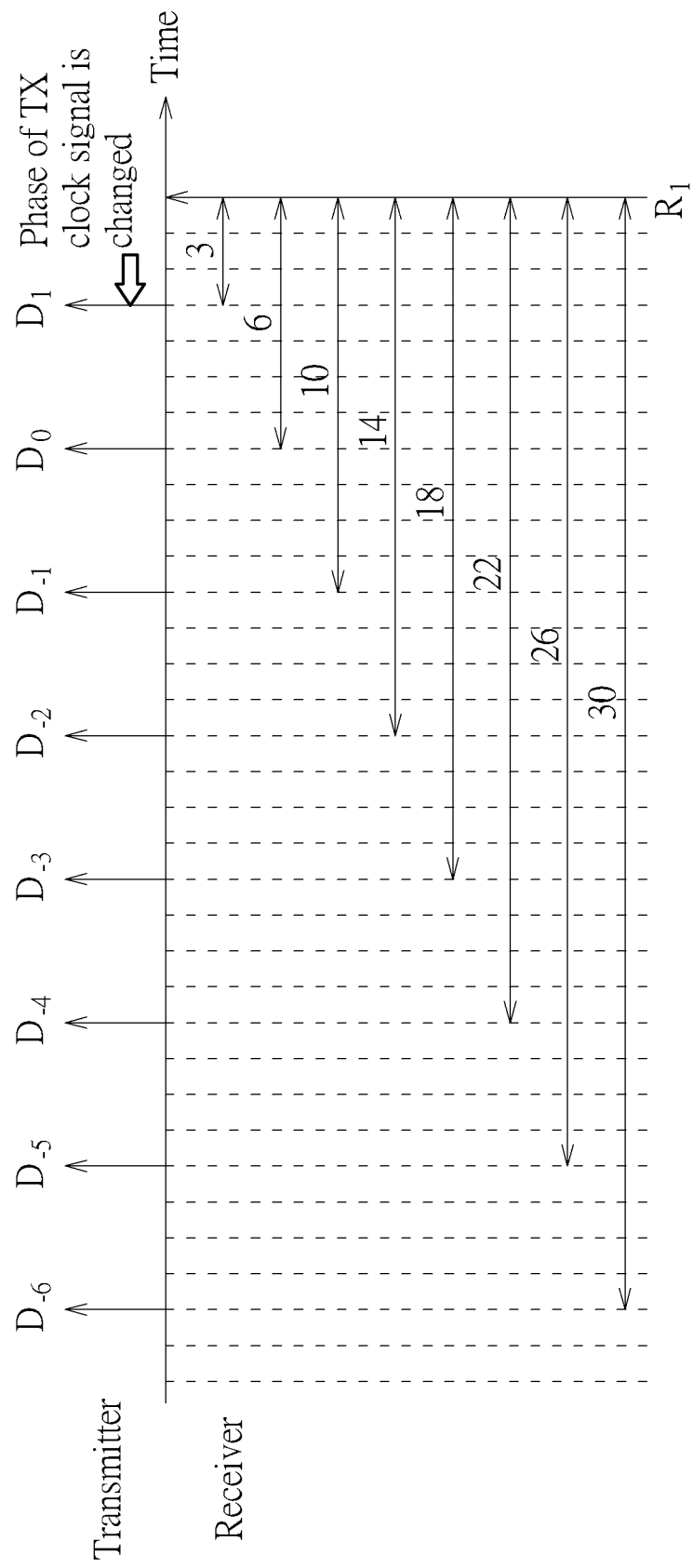
Figure 2D:
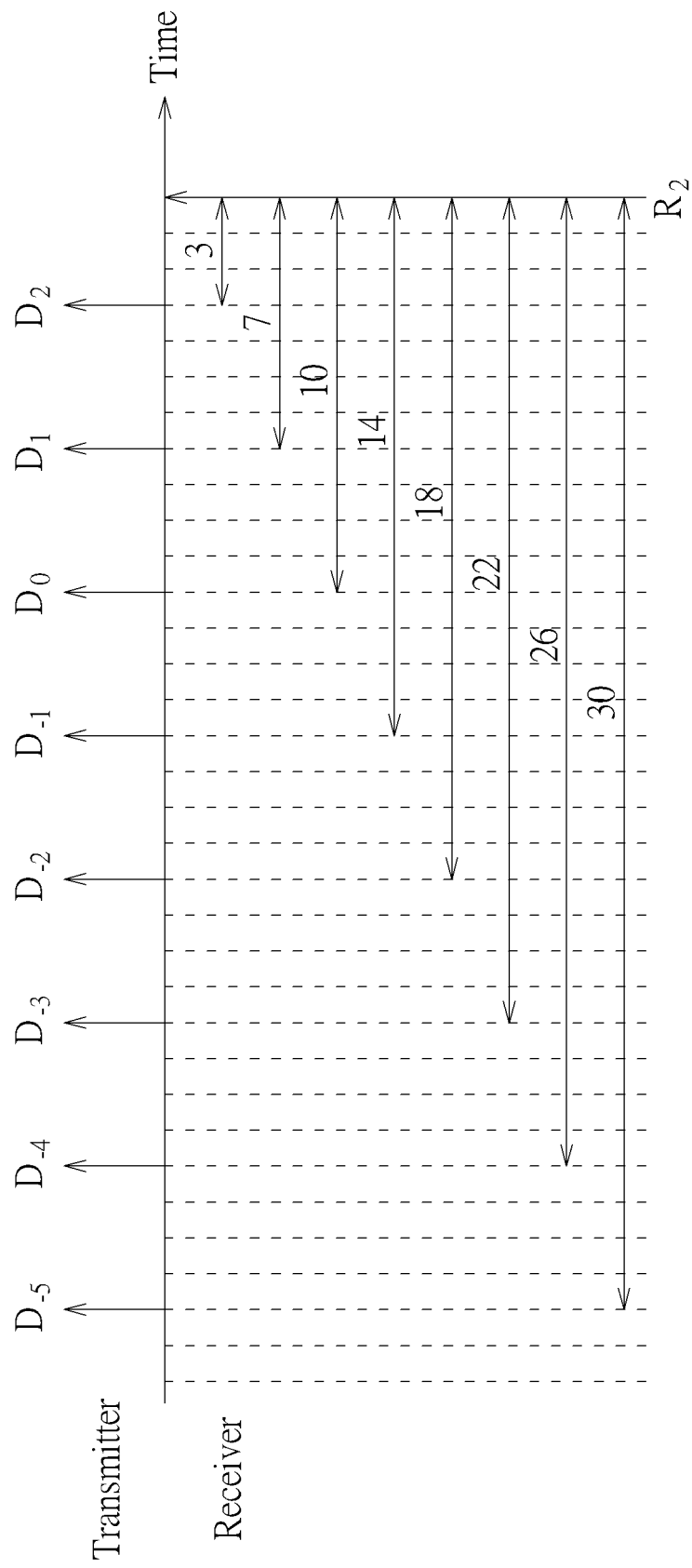

In FIG. 2C, assuming that the transmitting circuit 160 uses the phase-adjusted clock signal CLK to generate data D1 in the next cycle of the clock signal CLK, then the time differences between $R_1$ and each of $D_1$-$D_{-6}$ become "3", "6", "10", "14", "18", "22", "26", "30", that is, the first tap coefficient C0 of the echo response returns to the original value. Then, in FIG. 2D, the time differences between $R_2$ and each of $D_2$-$D_{-5}$ becomes "3", "7", "10", "14", "18", "22", "26", "30", that is the first tap coefficient C0 and the second tap coefficient C1 of the echo response return to the original values.

As described above, when the ADC 110 uses the phase-adjusted clock signal CLK to sample the analog input signal Vin, the tap coefficients C0-C7 of the echo response are changed, and then the transmitting circuit 160 uses the phase-adjusted clock signal CLK to generate the digital transmitting signal D_TX, the tap coefficients C0-C7 of the echo response will sequentially return to the original values. The tap coefficients of the echo response can be shown in Table 1, where T0-T11 represent the periods/cycles of the clock signal CLK, and C1'-C7' represent the tap coefficients of the transient echo response caused by the phase change/adjustment of the clock signal CLK, and the number in each bracket represents the time different between the digital transmitting signal D_TX and the time point that the ADC 110 uses the clock signal CLK to sample the analog input signal Vin (e.g. $R_{-1}$-$R_2$ shown in FIGS. 2A-2D).

TABLE 1

| T0 | C0(3)  | C1(7)  | C2(11)  | C3(15)  | C4(19)  | C5(23)  | C6(27)  | C7(31)  |
|----|--------|--------|---------|---------|---------|---------|---------|---------|
| T1 | C0'(2) | C1'(6) | C2'(10) | C3'(14) | C4'(18) | C5'(22) | C6'(26) | C7'(30) |
| T2 | C0'(2) | C1'(6) | C2'(10) | C3'(14) | C4'(18) | C5'(22) | C6'(26) | C7'(30) |
| T3 | C0(3)  | C1'(6) | C2'(10) | C3'(14) | C4'(18) | C5'(22) | C6'(26) | C7'(30) |
| T4 | C0(3)  | C1(7)  | C2'(10) | C3'(14) | C4'(18) | C5'(22) | C6'(26) | C7'(30) |
| T6 | C0(3)  | C1(7)  | C2(11)  | C3'(14) | C4'(18) | C5'(22) | C6'(26) | C7'(30) |
| T7 | C0(3)  | C1(7)  | C2(11)  | C3(15)  | C4'(18) | C5'(22) | C6'(26) | C7'(30) |
| T8 | C0(3)  | C1(7)  | C2(11)  | C3(15)  | C4(19)  | C5'(22) | C6'(26) | C7'(30) |
| T9 | C0(3)  | C1(7)  | C2(11)  | C3(15)  | C4(19)  | C5(23)  | C6'(26) | C7'(30) |

TABLE 1-continued

| | | | | | | | | |
|---|---|---|---|---|---|---|---|---|
| T10 | C0(3) | C1(7) | C2(11) | C3(15) | C4(19) | C5(23) | C6(27) | C7'(30) |
| T11 | C0(3) | C1(7) | C2(11) | C3(15) | C4(19) | C5(23) | C6(27) | C7(31) |

Referring to the contents of Table 1, if the tap coefficient of each period is subtracted from the tap coefficients C0-C7 of the steady echo response, the contents of Table 2 shown below will be obtained, where the contents of Table 2 are the echo response adjustment signal D_ERT outputted by the transient circuit 124.

TABLE 2

| | | | | | | | | |
|---|---|---|---|---|---|---|---|---|
| T0  | 0   | 0   | 0   | 0   | 0   | 0   | 0   | 0   |
| T1  | ΔC0 | ΔC1 | ΔC2 | ΔC3 | ΔC4 | ΔC5 | ΔC6 | ΔC7 |
| T2  | ΔC0 | ΔC1 | ΔC2 | ΔC3 | ΔC4 | ΔC5 | ΔC6 | ΔC7 |
| T3  | 0   | ΔC1 | ΔC2 | ΔC3 | ΔC4 | ΔC5 | ΔC6 | ΔC7 |
| T4  | 0   | 0   | ΔC2 | ΔC3 | ΔC4 | ΔC5 | ΔC6 | ΔC7 |
| T6  | 0   | 0   | 0   | ΔC3 | ΔC4 | ΔC5 | ΔC6 | ΔC7 |
| T7  | 0   | 0   | 0   | 0   | ΔC4 | ΔC5 | ΔC6 | ΔC7 |
| T8  | 0   | 0   | 0   | 0   | 0   | ΔC5 | ΔC6 | ΔC7 |
| T9  | 0   | 0   | 0   | 0   | 0   | 0   | ΔC6 | ΔC7 |
| T10 | 0   | 0   | 0   | 0   | 0   | 0   | 0   | ΔC7 |
| T11 | 0   | 0   | 0   | 0   | 0   | 0   | 0   | 0   |

In one embodiment, in consideration of the delay in the transceiver circuit 100, the processing circuit 150 will first detect a pattern of the echo response adjustment signal D_ERT when the phase of the clock signal CLK is changed/adjusted many times, where the pattern includes a starting point (i.e., T1 in Table 2) at which the echo response adjustment signal D_ERT starts when the phase of the clock signal CLK changes, and a time point when the first tap coefficient in the echo response adjustment signal D_ERT returns to zero (i.e., T3 of Table 2). After the pattern of the echo response adjustment signal D_ERT is determined, the processing circuit 150 can directly adjust the tap coefficients AC0-AC7 used in the FIR filter in the transient circuit 124 according to the determined pattern every time the phase of the clock signal CLK changes thereafter, to correctly generate the echo response adjustment signal D_ERT.

Figure 3:
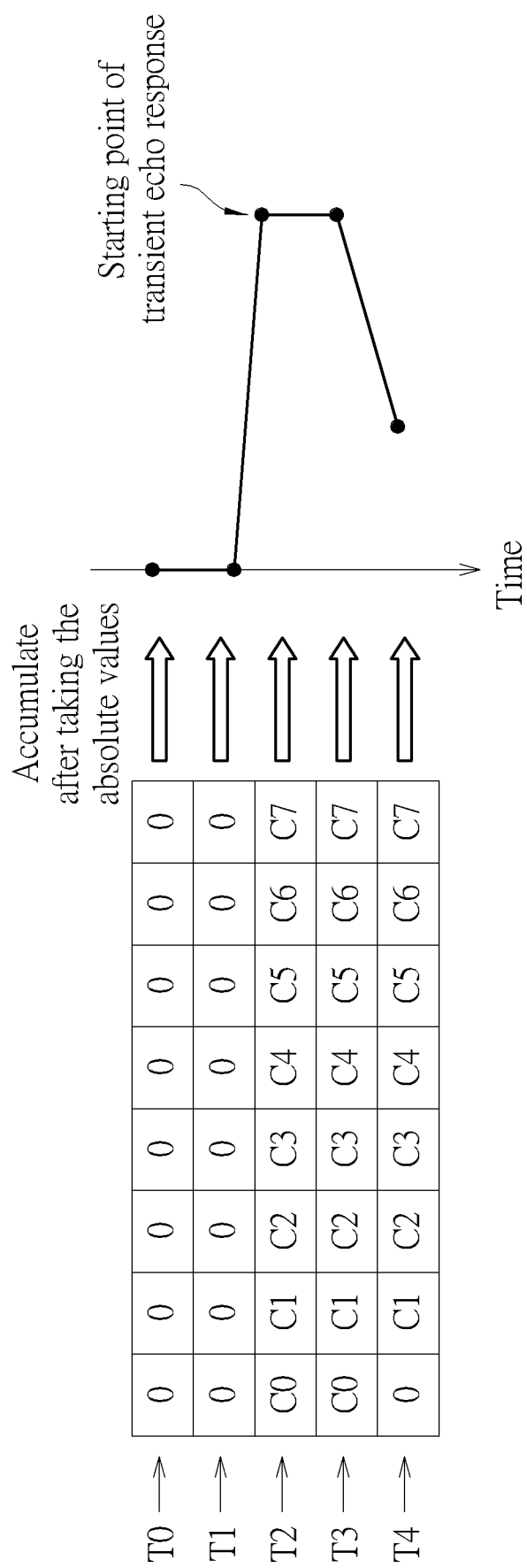
FIG. 3 shows a diagram of determining a starting point of an echo response adjustment signal.

For example, regarding the starting point of the echo response adjustment signal D_ERT, when the phase of the clock signal CLK changes, the transmitting circuit 160 may generate specific data to the transient circuit 124, for the transient circuit 124 to generate the echo response adjustment signal D_ERT at the period T0 (that is, can be regarded as an error signal). Later, when the phase of the clock signal CLK is changed, the echo response adjustment signal D_ERT is repeatedly generated at the period T0, so as to use the LMS algorithm to generate suitable tap coefficients. In this embodiment, because there is no error occurs during the period T0, the tap coefficients cannot be generated (that is, the tap coefficients are all 0). Therefore, it can be determined that the period T0 is not the starting point of the echo response adjustment signal D_ERT. Then, when the phase of the clock signal CLK is changed, the transmitting circuit 160 may generate specific data to the transient circuit 124, for the transient circuit 124 to generate the echo response adjustment signal D_ERT at the period T1. Later, when the phase of the clock signal CLK is changed, the echo response adjustment signal D_ERT is repeatedly generated at the period T1, so as to use the LMS algorithm to generate suitable tap coefficients. In this embodiment, because there is an error occurs during the period T1, the tap coefficients C0-C7 can be obtained. Therefore, it can be determined that the period T1 is the starting point of the echo response adjustment signal D_ERT. FIG. 3 shows a diagram for determining a starting point of the echo response adjustment signal D_ERT. The processing circuit 150 may accumulate absolute values of the tap coefficients C0-C7 to generate an accumulated value, and the time point corresponding to the accumulated value starting to increase can be regarded as the starting point of the echo response adjustment signal D_ERT.

Figure 4A:
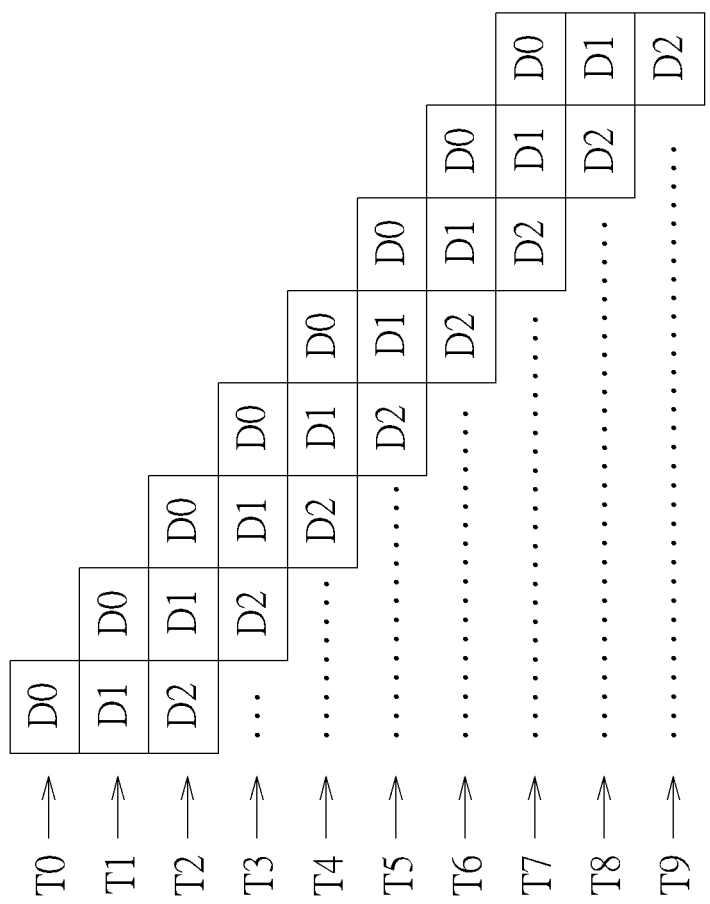
FIG. 4A is a diagram of specific data.
Figure 4B:
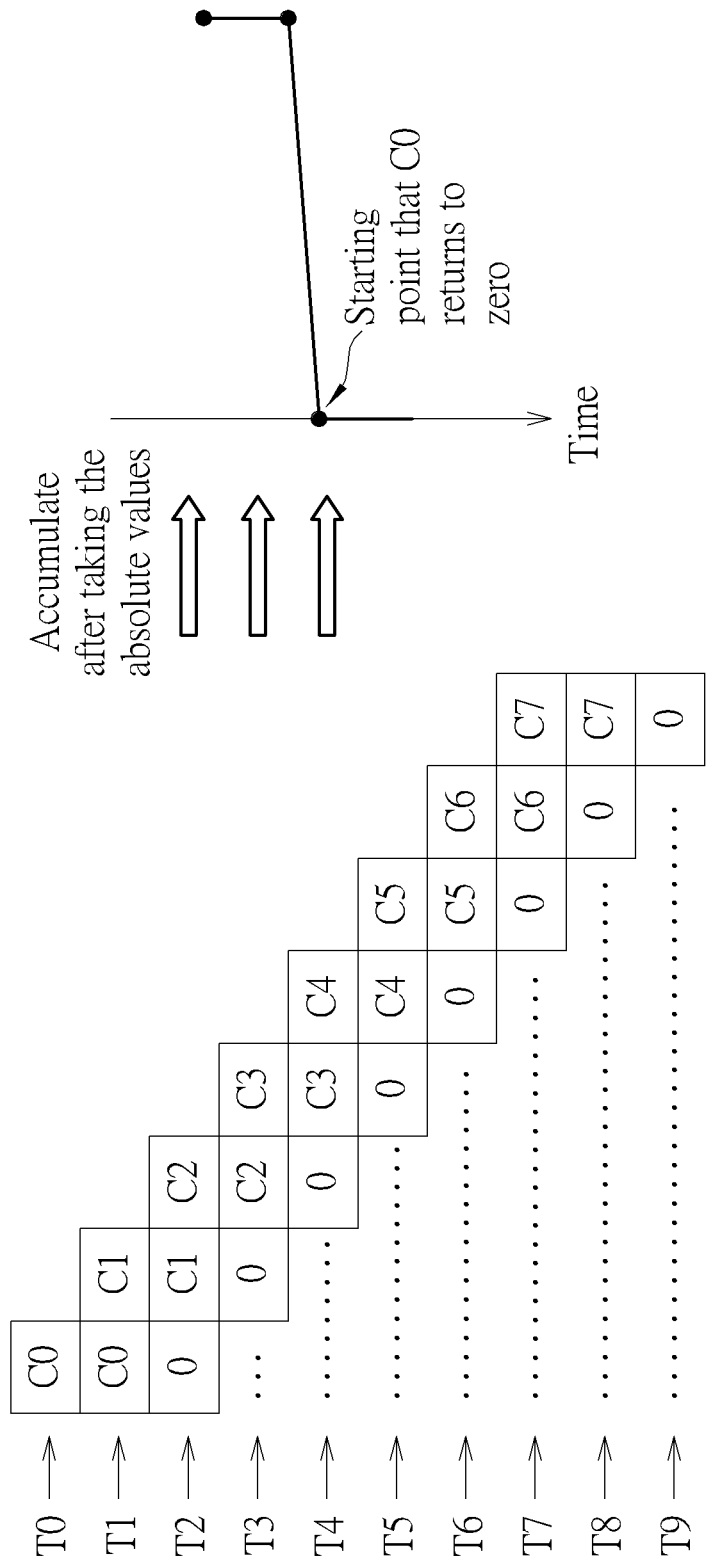
FIG. 4B is a diagram showing a time point when a first coefficient in the echo response adjustment signal is determined to be zero.

After the echo response adjustment signal D_ERT starts to be generated, the transmitting circuit 160 may transmit specific data as shown in FIG. 4A to the transient circuit 124 when the phase of the clock signal CLK is changed many times, for the transient circuit 124 to generate the echo response adjustment signal D_ERT, and for using the LMS algorithm to generate suitable tap coefficients, and to obtain the time point when the first coefficient in the echo response adjustment signal D_ERT returns to zero. FIG. 4B shows a diagram for determining the time point when the first coefficient in the echo response adjustment signal D_ERT returns to zero. The processing circuit 150 may accumulate the absolute values of the tap coefficients C0-C7 corresponding to the data D0, accumulate the absolute values of the tap coefficients C0-C7 corresponding to the data D1, accumulate the absolute values of the tap coefficients C0-C7 corresponding to the data D2, . . . , and the time point when the accumulated value starts to decrease can be regarded as the time point that the first coefficient in the echo response adjustment signal D_ERT returns to zero.

It is noted that the above calculation method for determining the pattern of the echo response adjustment signal D_ERT is only an example, and not a limitation of the present invention. In other embodiments, the transmitting circuit 160 may generate different data, and the processing circuit 150 may also use other calculation methods to determine the pattern of the echo response adjustment signal D_ERT.

Figure 5:
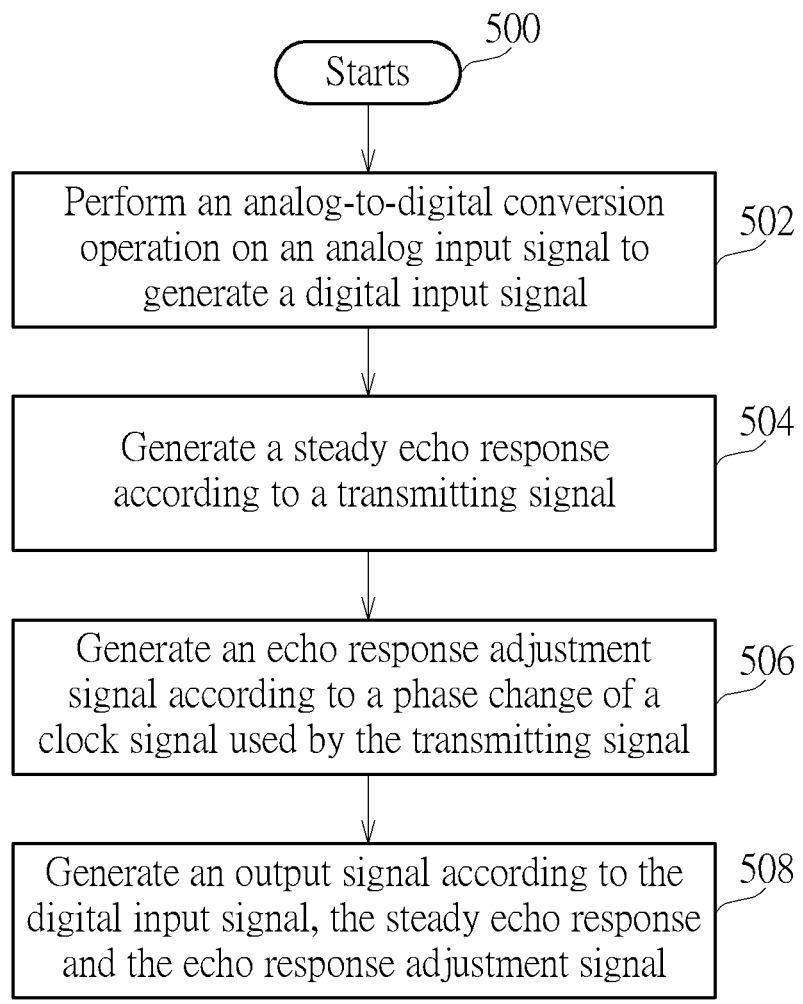
FIG. 5 is a flowchart of a signal processing method applied to a transceiver circuit according to one embodiment of the present invention.

FIG. 5 is a flowchart of a signal processing method applied to a transceiver circuit according to one embodiment of the present invention. Referring to the descriptions of the above embodiments, the signal processing method is described as follows.

Step 500: the flow starts.

Step 502: perform an analog-to-digital conversion operation on an analog input signal to generate a digital input signal.

Step 504: generate a steady echo response according to a transmitting signal.

Step 506: generate an echo response adjustment signal according to a phase change of a clock signal used by the transmitting signal.

Step 508: generate an output signal according to the digital input signal, the steady echo response and the echo response adjustment signal.

Briefly summarized, in the transceiver circuit of the present invention, a transient circuit is provided in the echo-cancellation circuit to effectively eliminate the transient echo response when the phase of the clock signal used by the transmitter is changed. The transceiver circuit of the embodiment can avoid the problem that the signal quality is greatly reduced when the phase of the clock signal is changed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transceiver circuit, comprising:
   an analog-to-digital converter (ADC), for performing an analog-to-digital conversion operation on an analog input signal to generate a digital input signal;
   an echo-cancellation circuit, wherein the echo-cancellation circuit comprises:
      a steady circuit, for generating a steady echo response according to a transmitting signal;
      a transient circuit, for generating an echo response adjustment signal according to a phase change of a clock signal used by the transmitting signal; and
      an output circuit, for generating an output signal according to the digital input signal, the steady echo response and the echo response adjustment signal.

2. The transceiver circuit of claim 1, further comprising:
   a processing circuit, for referring to the output signal to determine a pattern of the echo response adjustment signal generated due to the phase change of the clock signal used by the transmitting signal.

3. The transceiver circuit of claim 2, wherein the pattern comprises a starting point that the echo response adjustment signal starts to generate when the phase of the clock signal used by the transmitting signal changes, and a time point that a first tap coefficient in the echo response adjustment signal returns to zero.

4. The transceiver circuit of claim 2, wherein after the processing circuit determines the pattern of the echo response adjustment signal, each time the phase of the clock signal used by the transmitting signal changes, the processing circuit generates a plurality of tap coefficients of a filter of the transient circuit for generating the echo response adjustment signal.

5. The transceiver circuit of claim 1, wherein the transient circuit is enabled only when the phase of the clock signal used by the transmitting signal is changed to generate the echo response adjustment signal.

6. The transceiver circuit of claim 1, wherein a difference between the steady echo response and the echo response adjustment signal constitutes a transient echo response, and the output circuit generates the output signal by subtracting the transient echo response from the digital input signal.

7. The transceiver circuit of claim 1, wherein the ADC uses the clock signal to perform the analog-to-digital conversion operation on the analog input signal to generate the digital input signal, and the transceiver circuit further comprises:
   a transmitting circuit, configured to generate the transmitting signal according to the clock signal;
   a clock generating circuit, configured to generate the clock signal to the ADC and the transmitting circuit; and
   a control circuit, configured to generate a control signal to the clock signal generating circuit to adjust the phase of the clock signal.

8. The transceiver circuit of claim 7, wherein when the control circuit generates the control signal to the clock generating circuit to adjust the phase of the clock signal, the transmitting circuit generates specific data to the echo-cancellation circuit for the transient circuit to generate the echo response adjustment signal, for the output circuit to generate the output signal; and the transceiver circuit further comprises:
   a processing circuit, configured to determine a pattern of the echo response adjustment signal according to the transmitting signal.

9. A signal processing method applied to a transceiver circuit, comprising:
   performing an analog-to-digital conversion operation on an analog input signal to generate a digital input signal;
   generating a steady echo response according to a transmitting signal;
   generating an echo response adjustment signal according to a phase change of a clock signal used by the transmitting signal; and
   generating an output signal according to the digital input signal, the steady echo response and the echo response adjustment signal.

10. The signal processing method of claim 9, further comprising:
    referring to the output signal to determine a pattern of the echo response adjustment signal generated due to the phase change of the clock signal used by the transmitting signal.

11. The signal processing method of claim 10, wherein the pattern comprises a starting point that the echo response adjustment signal starts to generate when the phase of the clock signal used by the transmitting signal changes, and a time point that a first tap coefficient in the echo response adjustment signal returns to zero.

12. The signal processing method of claim 9, wherein a difference between the steady echo response and the echo response adjustment signal constitutes a transient echo response, and the step of generating the output signal comprises:
    generating the output signal by subtracting the transient echo response from the digital input signal.

* * * * *